(12) United States Patent
Steeves

(10) Patent No.: US 9,723,742 B2
(45) Date of Patent: Aug. 1, 2017

(54) INTEGRATED POWER RACKS AND METHODS OF ASSEMBLING THE SAME

(71) Applicant: General Electric Company, Schenectady, NY (US)

(72) Inventor: Michael Clyde Steeves, Garland, TX (US)

(73) Assignee: General Electric Company, Schenectady, NY (US)

(*) Notice: Subject to any disclaimer, the term of this patent is extended or adjusted under 35 U.S.C. 154(b) by 177 days.

(21) Appl. No.: 14/252,304

(22) Filed: Apr. 14, 2014

(65) Prior Publication Data

US 2015/0295389 A1     Oct. 15, 2015

(51) Int. Cl.
*H05K 7/14* (2006.01)
*H02B 1/20* (2006.01)
*G06F 1/00* (2006.01)

(52) U.S. Cl.
CPC ............... *H05K 7/14* (2013.01); *G06F 1/00* (2013.01); *H02B 1/205* (2013.01); *H05K 7/1492* (2013.01)

(58) Field of Classification Search
CPC .......... H05K 7/14; H05K 7/1485; H05K 7/20; H05K 5/00; F24F 7/007; F24F 11/04; F24F 13/04; F28D 15/00; G06F 1/16; G06F 1/20
USPC .............. 29/825; 439/581; 333/238, 246; 454/184; 361/679.47–679.53, 690–697, 361/703, 724
See application file for complete search history.

(56) References Cited

U.S. PATENT DOCUMENTS

| 4,426,587 A | 1/1984 | Nouet |
| 7,560,831 B2 | 7/2009 | Whitted et al. |
| 7,962,298 B2 | 6/2011 | Przydatek et al. |
| 8,080,900 B2 | 12/2011 | Corhodzic et al. |

(Continued)

FOREIGN PATENT DOCUMENTS

| CN | 101718825 A | 6/2010 |
| CN | 101726639 B | 6/2012 |
| CN | 102545355 A | 7/2012 |

OTHER PUBLICATIONS

"Power Distribution Considerations for Data Center Racks," Avocent, Power White Paper, 2008, retrieved from website http://www.networkworld.com/whitepapers/nww/pdf/0907-PWR-WP-EN.pdf (8 pgs).

(Continued)

*Primary Examiner* — Courtney Smith
*Assistant Examiner* — Zhengfu Feng
(74) *Attorney, Agent, or Firm* — General Electric Company

(57) ABSTRACT

An integrated power rack for use in a data center is provided. The integrated power rack includes a top, a base, a first side and a second side extending between the base and the top, a back member extending between the top, the base, the first side, and the second side, a divider extending from the top to the base, the divider positioned between the first side and the second side, a revenue sub-compartment defined between the first side and the divider, the revenue sub-compartment configured to receive a plurality of revenue producing devices, and a power sub-compartment defined between the second side and the divider, the power sub-compartment housing power equipment that is configured to provide direct-current (DC) power to the revenue sub-compartment.

20 Claims, 4 Drawing Sheets

(56) References Cited

U.S. PATENT DOCUMENTS

| | | | |
|---|---|---|---|
| 8,305,737 B2 | 11/2012 | Ewing et al. | |
| 2010/0317278 A1* | 12/2010 | Novick | H05K 7/20836 |
| | | | 454/184 |
| 2013/0057072 A1 | 3/2013 | Wang et al. | |
| 2013/0221748 A1 | 8/2013 | Meinke et al. | |
| 2013/0235524 A1* | 9/2013 | Baba | H05K 7/1452 |
| | | | 361/695 |
| 2015/0295389 A1* | 10/2015 | Steeves | H02B 1/205 |
| | | | 361/624 |

OTHER PUBLICATIONS

"Power Distribution in Data Centers: STARLINE Track Busway, PX™ iPDUs and Power IQ®", Raritan, White Paper, 2011, retrieved from http://www.raritan.com/resources/whitepapers/power-management/Universal-Electric-WhitePaper-C1034.pdf (10 pgs).

* cited by examiner

INTEGRATED POWER RACKS AND METHODS OF ASSEMBLING THE SAME

BACKGROUND

The field of the disclosure relates generally to racks for use in housing revenue producing equipment, such as servers, and more specifically to integrated power racks having a side power sub-compartment that facilitates increased power transmission efficiency and increased space for revenue producing devices.

Large data processing centers (e.g., server farms) are used to perform data transactions such as, without limitation, storing, retrieving, and/or processing data, for companies and individuals all over the world. In particular, known data processing centers use computing devices, referred to herein as revenue producing devices, to perform data transactions on behalf of third parties in return for a fee. As the fee is typically based on the number of transactions performed, known data processing centers use large quantities of revenue producing devices to perform large quantities of data transactions.

However, large quantities of revenue producing devices require a significant amount of space. As such, known data processing centers use equipment racks to house and stack the revenue producing devices. Known equipment racks are typically box-shaped compartments that are, for example, about 7 feet in height, about 24 inches in width, and a variety of depths. The width dimension is specifically designed so that an entire row of racks fit on a standard 2×2 floor tile in a warehouse or office building. To facilitate interoperability amongst manufacturers, the majority of revenue producing devices manufactured for use within a rack are a predetermined standard size, referred to as a U (unit). A standard U is about 19 inches in width and 1.75 inches in height. Some revenue producing devices require multiple Us of space (e.g. 2U). Such devices have the same width (e.g., 19 inches) but the height is increased (e.g., doubled to 3.5 inches). Accordingly, in a typical rack, all of the revenue producing devices are about 19 inches in width, and positioned centrally within the rack. As known racks are about 24 inches in width, the 19 inch racks define gaps on either side that may be empty and/or used to run cables, such as data transmission cables, between the revenue producing devices.

Revenue producing devices may also require a significant amount of power to operate. In particular, many data processing centers operate 24 hours a day 7 days a week, with the revenue producing devices using constant power. Power distribution to the revenue producing devices is further complicated by the fact that revenue producing devices generally require low-voltage direct current (DC) power (e.g., 12-54 volts DC) to operate, while the power grid utilizes high-voltage alternating current (AC) power (e.g., 208/480 volts AC).

In some known data processing centers, the high-voltage AC power from the power grid is received by a main conversion hub that converts the high-voltage AC power to low-voltage DC power useable by the revenue producing devices. From the main conversion hub, the low-voltage DC power is routed to each rack and then to each revenue producing device. However, such systems are plagued by significant resistive power losses caused by transmitting the low-voltage DC power over long distances throughout the data processing center. Furthermore, such systems can be susceptible to widespread power failure when the main conversion hub fails.

Other known data processing centers use integrated power racks having power equipment (e.g., without limitation, uninterruptable power supplies (UPS), AC/DC power converters, transformers, filters, and/or other power devices) housed in the rack. For these data processing centers, the high-voltage AC power is routed to each rack, and the power equipment inside the rack generates the low-voltage DC power used by the revenue producing devices within that rack. As the high-voltage AC power is routed to each rack, transmission losses are reduced as compared with the low-voltage DC transmission of a central hub. However, known integrated power racks may sacrifice between 4 and 8 U worth of space at the base of the rack to accommodate the power conversion equipment. Accordingly, integrating the power conversion within the rack will reduce the amount of revenue producing devices stored within each rack, which reduces the number of data transactions that can be performed by the data processing center. In addition, routing high-voltage AC power to the power equipment at the base of the rack can create additional safety hazards that must be mitigated through the use of covers and other devices. With the power conversion equipment located at the base of the rack, the low-voltage DC power must be run through the majority of the height of the rack using DC rails/bus bars. Accordingly, known integrated power racks have relatively long and expensive DC rails/bus bars with high resistive power losses.

BRIEF DESCRIPTION

In one aspect, an integrated power rack for use in a data center is provided. The integrated power rack includes a top, a base, a first side and a second side extending between the base and the top, a back member extending between the top, the base, the first side, and the second side, a divider extending from the top to the base, the divider positioned between the first side and the second side, a revenue sub-compartment defined between the first side and the divider, the revenue sub-compartment configured to receive a plurality of revenue producing devices, and a power sub-compartment defined between the second side and the divider, the power sub-compartment housing power equipment that is configured to provide direct-current (DC) power to the revenue sub-compartment.

In another aspect, a data center for performing data transactions is provided. The data center includes a plurality of revenue producing devices, and at least one integrated power rack configured to be electrically coupled to an electrical power source. The integrated power rack includes a top, a base, a first side and a second side extending between the base and the top, a back member extending between the top, the base, the first side, and the second side, a divider extending from the top to the base, the divider positioned between the first side and the second side, a revenue sub-compartment defined between the first side and the divider, the revenue sub-compartment configured to house the plurality of revenue producing devices, and a power sub-compartment defined between the second side and the divider, the power sub-compartment housing power equipment configured to provide DC power to the revenue sub-compartment.

In yet another aspect, a method of assembling an integrated power rack is provided. The method includes providing a compartment including a top and a base spaced vertically apart from the top, positioning a first side between the base and the top, positioning a second side between the base and the top, positioning a back member between the top, the base, the first side, and the second side, positioning a divider between the top and base, and between the first side and the second side, defining a revenue sub-compartment between the first side and the divider, the revenue sub-compartment configured to receive a plurality of revenue producing devices, and defining a power sub-compartment between the second side and the divider, the power sub-compartment including power equipment that is configured to provide DC power to the revenue sub-compartment.

DETAILED DESCRIPTION

The embodiments described herein provide a data processing center having an integrated power rack, or cabinet, with a configuration that facilitates increasing the amount of revenue producing devices housed in the rack. The integrated power rack also facilitates increasing the efficiency of power equipment inside the rack. More specifically, the data processing center has an integrated power rack that includes a compartment with a top, a base, and first and second sides extending from the top to the base. The rack also includes a divider that extends between the top and the base; dividing the compartment into a revenue sub-compartment and a power sub-compartment. The revenue sub-compartment is configured to receive a plurality of revenue producing devices vertically stacked from the base to the top. The power sub-compartment includes a plurality of AC/DC converters that are vertically spaced from the base to the top. The AC/DC converters are configured to generate low-voltage DC power (e.g., 12-54 volts DC) for use by the revenue producing devices. More specifically, each AC/DC converter generates low-voltage DC power for at least a portion of the revenue producing devices.

The embodiments described herein provide an integrated power rack, or cabinet, that enables additional revenue producing devices to be operated inside the rack. More specifically, by shifting the power equipment from the bottom of the rack to a side power sub-compartment, the rack is configured to receive additional revenue producing units in the space typically occupied by power conversion equipment. The embodiments described herein further facilitate increased power efficiency of the power equipment. More specifically, because the AC/DC conversion is performed at intervals throughout the power sub-compartment, the distance low-voltage DC power is transmitted over DC rails, or DC bus bars, is reduced. The integrated power rack described herein further facilitates reducing the amount of electrically conductive material necessary to fabricate the DC rails, reducing the capital cost of the integrated power rack. More specifically, the plurality of AC/DC converter units provide DC power to an adjacent portion of the revenue producing units using short-run DC buses.

Figure 1:
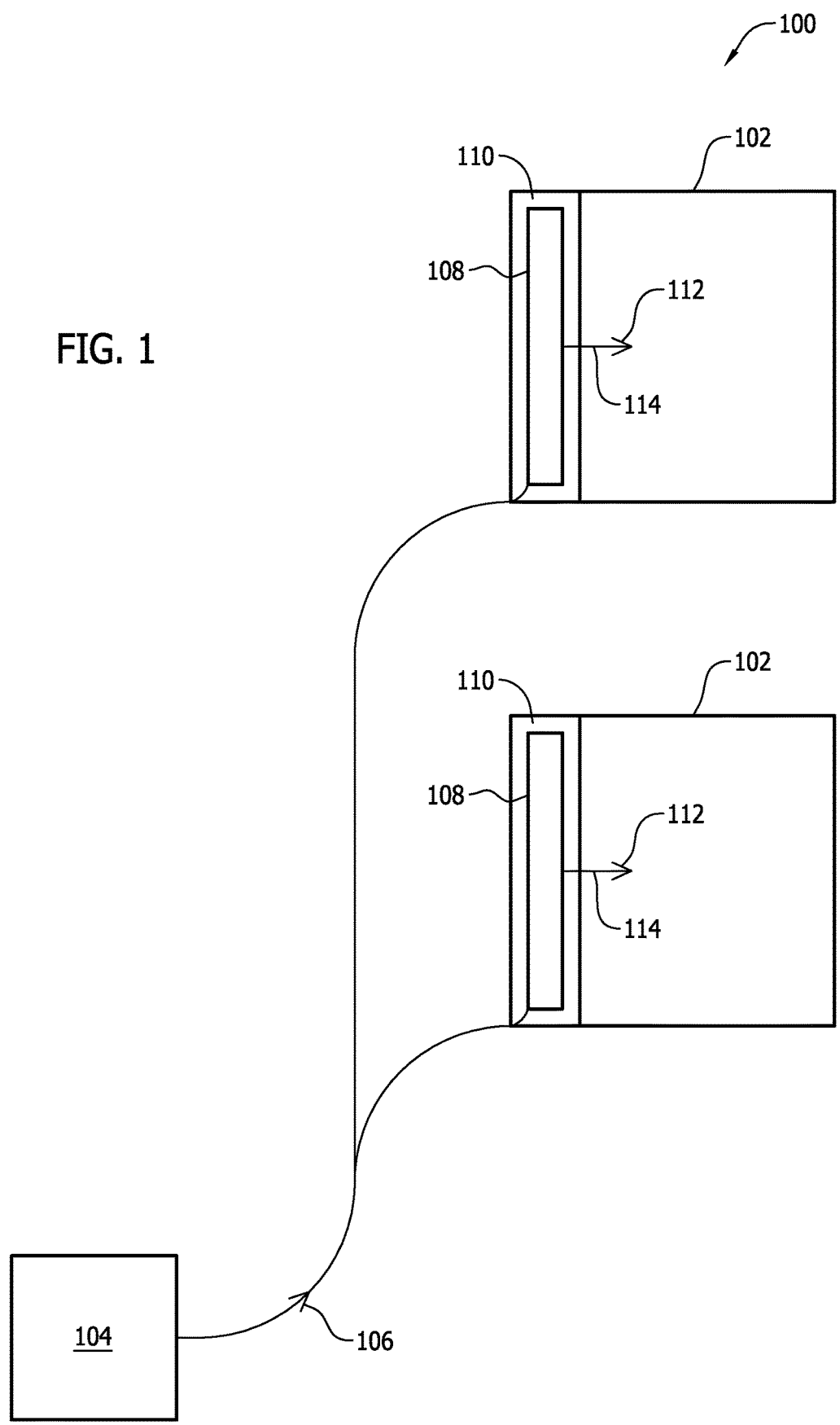
FIG. 1 is a block diagram of an exemplary data center for processing and/or storing data.

FIG. 1 is a block diagram of an exemplary data processing center 100 for use in performing data transactions. In the exemplary embodiment, data processing center 100 includes a plurality of integrated power racks 102. Integrated power racks 102 are configured to be electrically coupled to an electrical power source 104 and to receive high-voltage AC power 106, directly from electrical power source 104. Electrical power source 104 is, for example, the commercial power grid. Alternatively, integrated power racks 102 may receive power from any power source that enables integrated power racks 102 to operate as described herein.

In the exemplary embodiment, each power rack 102 includes power equipment 108 spaced vertically throughout a side power sub-compartment 110. Power equipment 108 is configured to convert high-voltage AC power 106 into low-voltage DC power 112 and to provide low-voltage DC power 112 to at least one DC rail, or bus bar 114. DC rail 114 is configured to provide low-voltage DC power 112 to revenue producing devices (not shown in FIG. 1).

Figure 2:
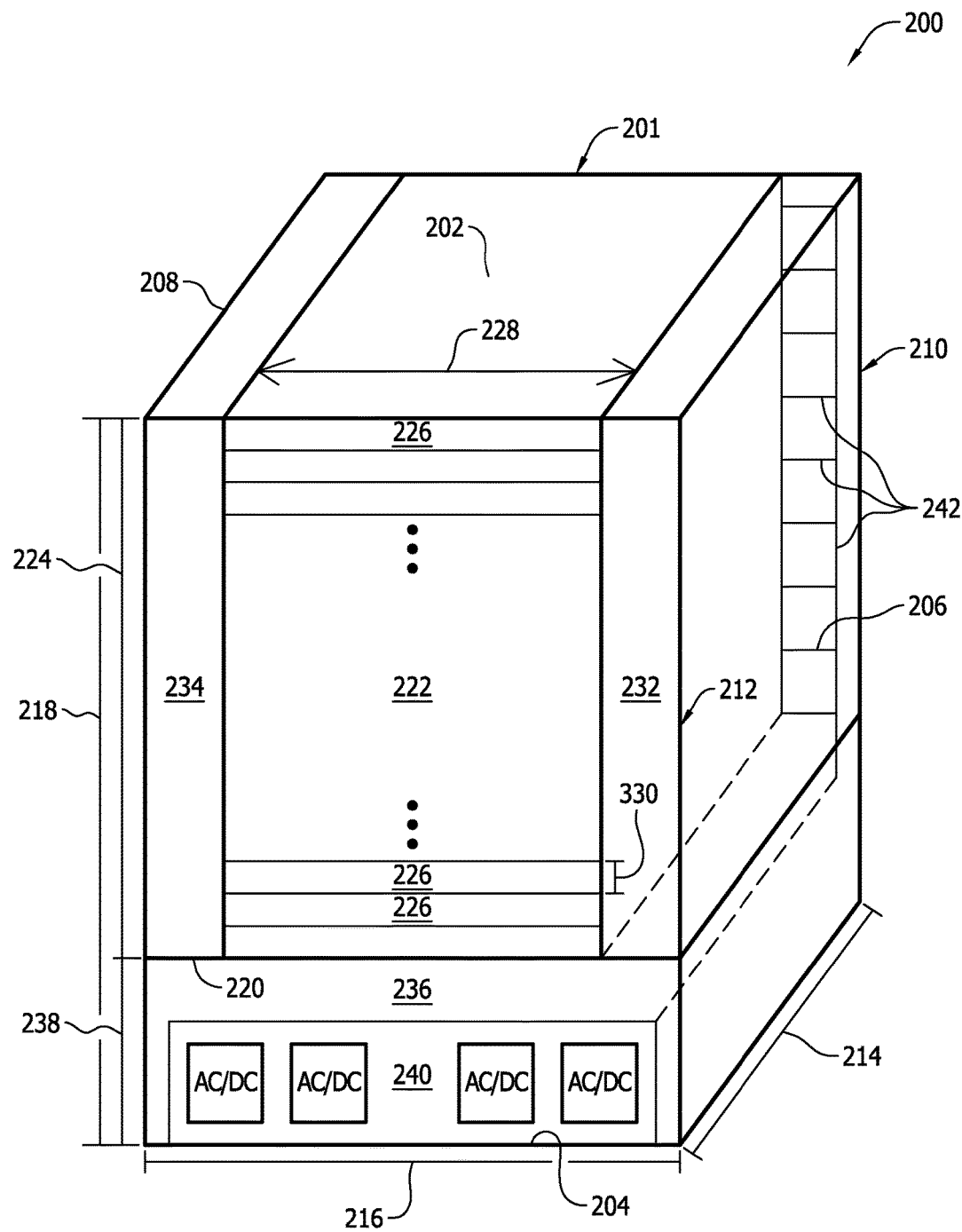
FIG. 2 is a perspective view of a power conversion rack as known in the prior art.

FIG. 2 is a perspective view of an integrated power rack 200 as known in the prior art. Rack 200 has a substantially rectangular compartment 201 having a top 202, a base 204, a first side 206 and a second side 208 that each extend from base 204 to top 202, and a back portion 210 and a front portion 212 defined on opposite sides of compartment 201. Rack 200 has a predetermined length 214, width 216, and height 218. Rack 200 includes a horizontal divider 220 that extends from first side 206 to second side 208 and from front portion 212 to back portion 210.

A revenue sub-compartment 222 having a height 224 is defined between horizontal divider 220 and top 202. Revenue sub-compartment 222 is configured to receive a plurality of revenue producing devices 226 of a predetermined length 214, width 228, and height 230. Width 228 of revenue producing devices 226 is less than width 216 of rack 200. For example, width 228 of revenue producing devices 226 may be about 19 inches while width 216 is about 24 inches. Revenue producing devices 226 are configured to be positioned centrally within rack 200 such that gaps 232 and 234 are formed on either side of revenue producing device 226. In one embodiment, gaps 232 and 234 include a plurality of cables, such as Ethernet cables, that couple two or more revenue producing devices 226 together.

A power sub-compartment 236 having a predetermined height 238 is defined between horizontal divider 220 and base 204. Height 238 may be, for example, between 4 and 8 times the height 230 of revenue producing devices 226 (i.e. 4-8 Us). Bottom power sub-compartment 236 includes power equipment 240 that provides DC power to revenue producing devices 226. More specifically, power equipment 240 provides DC power to at least one long-run DC rail 242 that extends from power equipment 240 through horizontal divider 220 to top 202.

In operation, power equipment 240 receives high-voltage AC power 106 from electrical power source 104 and converts high-voltage AC power 106 into low-voltage DC power 112 (all shown in FIG. 1). Power equipment 240 provides the DC power to long-run DC rails 242, and DC rail 242 transports low-voltage DC power 112 to each of the revenue producing devices 226.

Figure 3:
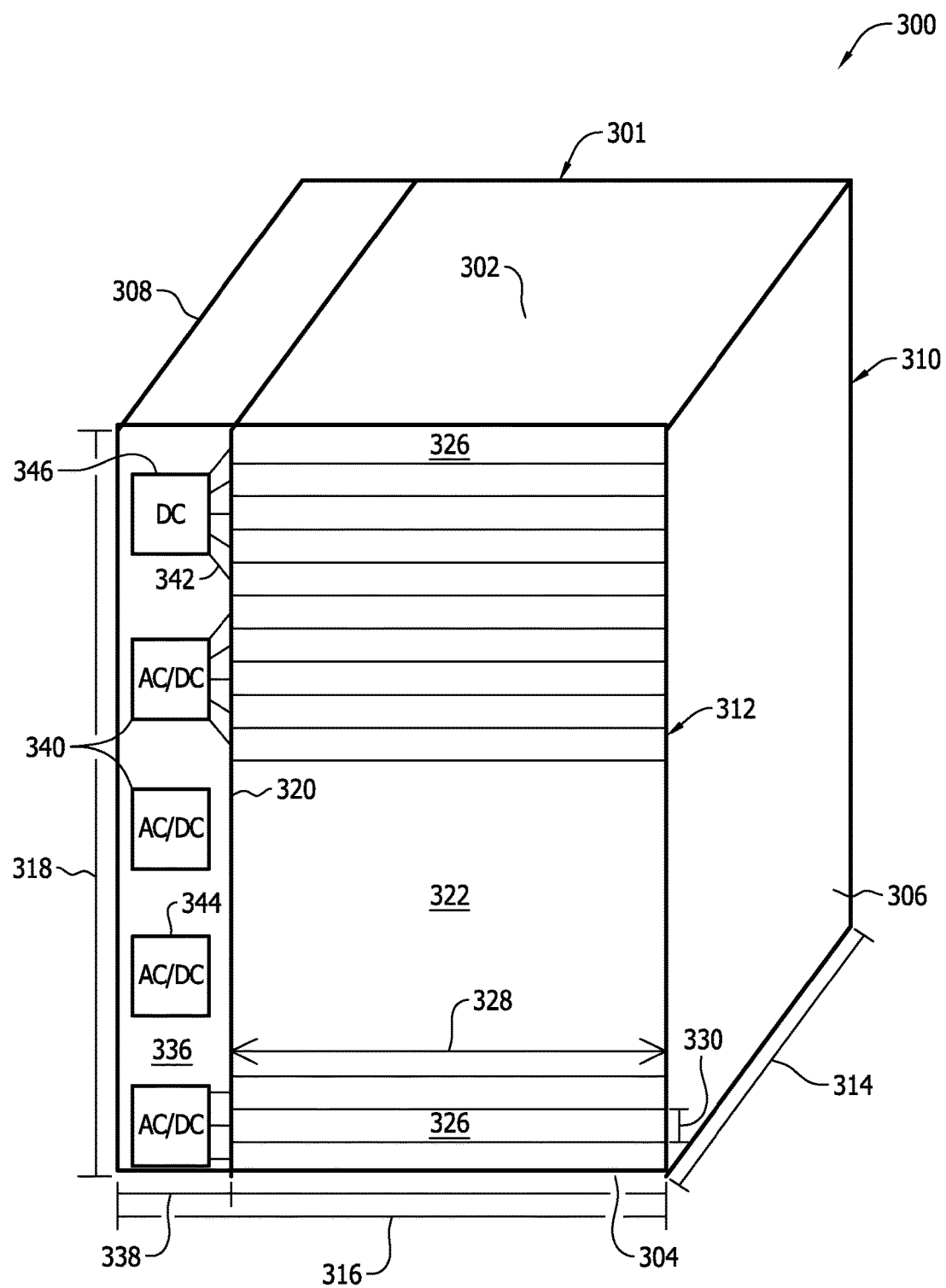
FIG. 3 is a perspective view of an exemplary integrated power conversion rack for use with the data center shown in FIG. 1.

FIG. 3 is a perspective view of an exemplary integrated power rack 300 for use with data center 100 (shown in FIG. 1). Rack 300 has a substantially rectangular compartment 301 having a top 302 and a base 304 spaced vertically apart from top 302. Compartment 301 also includes a first side 306 and a second side 308 extending from top 302 to base 304. Compartment 301 also includes a back portion 310 and a front portion 312 extending from top 302 to base 304 and from first side 306 to second side 308. Front portion 312 and/or back portion 310 may be open to the environment to facilitate inserting equipment into compartment 301. Compartment 301 has a predetermined length 314 defined between front portion 312 and back portion 310, a predetermined width 316 defined from first side 306 to second side 308, and a predetermined height 318 defined from top 302 to base 304. In the exemplary embodiment, length 314 and width 316 are about 2 feet long, and height 318 is about 7.5 feet tall such that height 318 is greater than length 314 and width 316. Accordingly, compartment 301 is configured to fit on a standard floor tile of a warehouse, and utilize a majority of the space from the floor to the ceiling. Alternatively, rack 300 may have any dimensions that enable rack 300 to operate as described herein. In the exemplary embodiment, base 304 is configured to be mounted on the floor of a building and/or warehouse.

Compartment 301 includes a divider 320 extending from front portion 312 to back portion 310 and from top 302 to base 304. Divider 320 is fabricated from a substantially non-electrically conductive material and facilitates physically and electrically isolating a revenue sub-compartment 322 from a power sub-compartment 336.

Revenue sub-compartment 322 has a predetermined length 314, height 318, and width 324 defined from first side 306 to divider 320. Revenue sub-compartment 322 is configured to receive a plurality of revenue producing devices 326 having a predetermined length 314, width 328, and height 330. In the exemplary embodiment, width 328 of revenue producing device 326 is slightly less (e.g., between 0 and 1 inches), than width 324 of revenue sub-compartment 322. For example, width 328 is about 19 inches wide and width 324 is about 19.25 inches wide. Accordingly, in one embodiment, revenue producing devices 226 are positioned tightly within rack 300. In the exemplary embodiment, revenue sub-compartment 322 is configured to receive vertically stacked revenue producing devices 326 for the full height 318 of compartment 301. Accordingly, revenue sub-compartment 322 is configured to receive, for example, 4-8 additional Us of revenue producing devices 326 than revenue sub-compartment 222 (shown in FIG. 2).

Power sub-compartment 336 is positioned between top 302 and base 304, between second side 308 and divider 320, and between back portion 310 and front portion 312. Power sub-compartment 336 has a predetermined length 314, height 318, and width 338 defined by second side 308 and divider 320. In the exemplary embodiment, power sub-compartment 336 has power equipment 340, such as, without limitation, UPS, AC/DC power converters, step-down transformers, filters, and/or rectifiers positioned therein. Power equipment 340 is configured to provide DC power to at least one DC rail 342.

In the exemplary embodiment, power sub-compartment 336 includes a plurality of AC/DC converters 344 spaced vertically from top 302 to base 304. Each AC/DC converter 344 is coupled to electrical power source 104 (shown in FIG. 1) and to at least one DC rail 342 such that each AC/DC converter 344 provides DC power to at least one revenue producing device 326. In some embodiments, power equipment 340 may also include at least one DC source 346, such as an energy storage device (e.g., a DC battery), capacitor, etc. Similar to AC/DC converters 344, DC source 346 provides DC power to at least one revenue producing device 326. Each of the plurality of AC/DC converters 344 are configured to provide DC power to a portion of the plurality of revenue producing devices 326 with a shortest distance from a respective one of the plurality of AC/DC converters 344. In an alternative embodiment, a plurality of DC rails 342 are configured to be electrically coupled to a respective one of the plurality of AC/DC converters 344. In another alternative embodiment, DC rail 342 is configured to be coupled to two or more of the plurality of AC/DC converters 344 to provide uninterrupted power should a failure in one of the plurality of AC/DC converters 344 occur.

DC rails 342 are electrical conductors fabricated from an electrically conductive material, such as, without limitation, copper. Each DC rail 342 extends laterally from AC/DC converter 344 in power sub-compartment 336 to a respective revenue producing device 326 in revenue sub-compartment 322. In one embodiment, revenue producing device 326 is coupled with DC rail 342 proximate divider 320 to facilitate reducing DC rail 342 length and/or resistive power losses. Accordingly, DC rail 342 is substantially shorter and more efficient than DC rails 242 (shown in FIG. 2).

In operation, power sub-compartment 336 receives high-voltage AC power 106 (shown in FIG. 1) from electrical power source 104. AC/DC converters 344 convert high-voltage AC power 106 into low-voltage DC power 112 (shown in FIG. 1) at vertically spaced intervals (e.g., every six inches) throughout power sub-compartment 336. Each AC/DC converter 344 provides DC power to at least one DC rail 342, and DC rail 342 provides the DC power to at least one revenue producing device 326. Revenue producing devices 326 receive the DC power and utilize the DC power to perform computing transactions and generate revenue. Furthermore, divider 320 isolates users of revenue sub-compartment 322 from the distributed AC power in power sub-compartment 336 to facilitate preventing electrical shocks.

Figure 4:
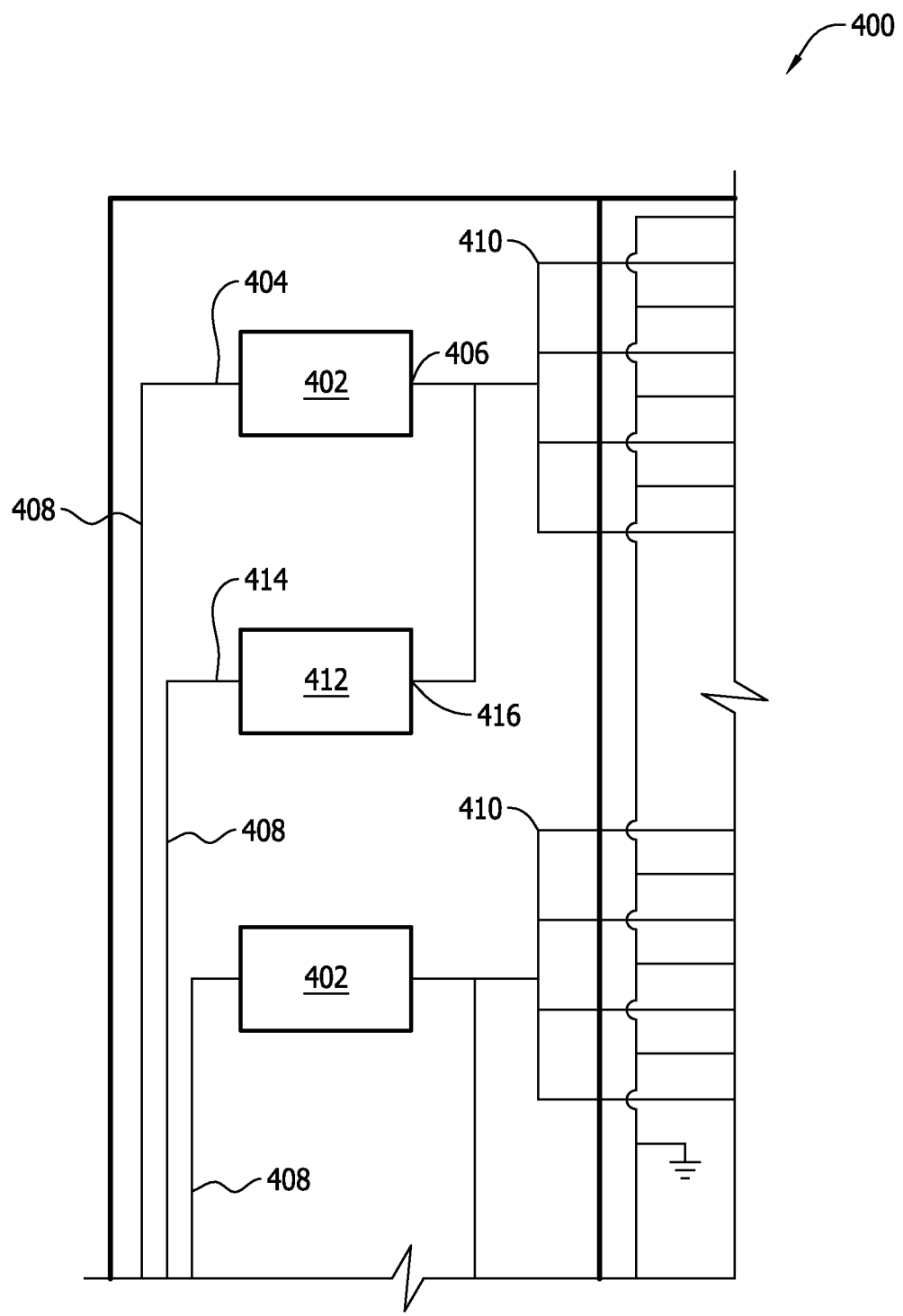
FIG. 4 is a view of an exemplary side power sub-compartment for use with the integrated power conversion rack shown in FIG. 3.

FIG. 4 is a schematic view of a portion of an alternative power sub-compartment 400 for use with integrated power rack 300 (shown in FIG. 3). Power sub-compartment 400 includes a plurality of vertically spaced primary AC/DC converters 402 having an input terminal 404 and an output terminal 406. Primary AC/DC converters 402 are electrically coupled to an AC rail 408 through input terminals 404. Each primary AC/DC converter 402 is also electrically coupled to a respective plurality of DC rails 410 through a respective output terminal 406. In the alternative embodiment, power-sub compartment 400 also includes a plurality of reserve AC/DC converters 412 having input terminals 414 and output terminals 416. Reserve AC/DC converters 412 are electrically coupled one or more AC rail 408 through input terminals 414. Reserve AC/DC converters 412 are also electrically coupled to at least one primary AC/DC converter 402 and respective DC rails 410 through a respective output terminal 416. In operation, reserve AC/DC converters 412 are configured to provide an uninterruptible power supply (UPS) function. More specifically, reserve AC/DC converters 412 are configured to charge when AC power is being received from AC rail 408 and discharge when AC power is not present on AC rail 408. Accordingly, when AC power is being received from AC rail 408, primary AC/DC converters 402 provide power to DC rails 410, and when AC power is not being received from AC rail 408 reserve AC/DC converters 412 provide power to DC rails 410 for a predetermined period of time. Reserve AC/DC converters 412 may also provide power to DC rails 410 during a failure of one of the plurality of AC/DC converters 402.

The embodiments described above provide a data processing center having an integrated power rack with a configuration that facilitates increasing the amount of revenue producing devices, such as servers, housed in the rack. The integrated power rack also facilitates increasing the efficiency of power equipment, such as AC/DC power converters, that provide DC power to the revenue producing devices. More specifically, the integrated power rack has a compartment with a top, a base, and first and second sides extending from the top to the base. A divider extends between the top and the base dividing the compartment into a revenue sub-compartment and a power sub-compartment. The revenue sub-compartment is configured to receive a plurality of revenue producing devices vertically stacked from the base to the top. The power sub-compartment includes a plurality of AC/DC converters that are vertically spaced from the base to the top. The AC/DC converters are configured to generate low-voltage DC power for use by the revenue producing devices. More specifically, each AC/DC converter generates DC power for at least a portion of the revenue producing devices.

The embodiments described above provide an integrated power rack that provides the following technical effects. The integrated power rack has a configuration that enables additional revenue producing devices to be operated inside the rack. More specifically, by shifting the power equipment from the bottom of the rack to a side power sub-compartment, the rack is configured to receive additional revenue producing units. The integrated power rack described herein further facilitates increased power efficiency of power equipment used by the integrated power rack by reducing the distance low-voltage DC power is transmitted over DC rails. More specifically, the plurality of AC/DC converter units provide output DC power to an adjacent portion of revenue producing units, reducing the length of the DC rails between the AC/DC converters and the revenue producing units. The integrated power rack described herein further facilitates reducing the amount of electrically conductive material necessary to fabricate the DC rails, reducing the capital cost of the integrated power rack. The integrated rack allows for better segregation of high-voltage AC from the revenue generating equipment area within the rack, leading to minimizing exposure to high-voltage AC while interacting with the revenue generating equipment.

Although described above with respect to several specific integrated power rack configurations, the present disclosure contemplates that additional configurations may be understood to one of ordinary skill in the art in view of the disclosure. Features of any of the described embodiments may be included with features of any other embodiment such that the integrated power rack functions as described herein.

Exemplary embodiments of systems and methods for increasing the amount of revenue producing devices and/or reducing power losses in an integrated power rack are described herein. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An integrated power rack for use in a data center, said integrated power rack comprising:
    a top;
    a base, wherein said integrated power rack has a height defined from said top to said base;
    a first side and a second side extending vertically between said base and said top, wherein said integrated power rack has a width defined from said first side to said second side;
    a back member extending between said top, said base, said first side, and said second side;
    a front portion opposite said back member and extending vertically between said top, said base, said first side, and said second side, wherein said front portion is open to an environment surrounding said integrated power rack, wherein said integrated power rack has a length defined from said front portion to said back member and the height is greater than the width and the length;
    a non-conductive divider extending from said top to said base and from said front portion to said back member, said non-conductive divider positioned between said first side and said second side;
    a revenue sub-compartment defined between said first side and said non-conductive divider from said front portion to said back member, said revenue sub-compartment sized to receive a plurality of revenue producing devices, wherein said revenue sub-compartment has a width that is substantially the same as a width of each of said plurality of revenue producing devices; and
    a power sub-compartment defined between said second side and said non-conductive divider from said front portion to said back member such that said power sub-compartment is spaced from said revenue sub-compartment in a horizontal direction along said front portion, wherein said power sub-compartment houses power equipment for providing direct-current (DC) power to said revenue sub-compartment.

2. The integrated power rack according to claim 1, wherein said power equipment comprises a plurality of alternating-current to direct-current (AC/DC) converters spaced from said top to said base.

3. The integrated power rack according to claim 2, further comprising a DC rail for electrically coupling one of said plurality of AC/DC converters to one of the plurality of revenue producing devices.

4. The integrated power rack according to claim 2, further comprising a plurality of DC rails for electrically coupling one of said plurality of AC/DC converters to at least two of the plurality of revenue producing devices.

5. The integrated power rack according to claim 1, wherein said revenue sub-compartment includes at least a portion of the front portion opposite said back member, the front portion open to the environment surrounding said integrated power rack.

6. The integrated power rack according to claim 2, further comprising a DC rail for electrically coupling one of said plurality of AC/DC converters to at least a portion of the plurality of revenue producing devices having a shortest distance from said one of said plurality of AC/DC converters.

7. The integrated power rack according to claim 1, wherein said revenue sub-compartment is sized to receive vertically spaced revenue producing devices from said base to said top.

8. The integrated power rack according to claim 7, wherein said base is mounted to a floor of a building.

9. A data center for performing data transactions, said data center comprising:
   a plurality of revenue producing devices; and
   at least one integrated power rack electrically coupled to an electrical power source, said integrated power rack comprising:
      a top;
      a base, wherein said integrated power rack has a height defined from said top to said base;
      a first side and a second side extending vertically between said base and said top, wherein said integrated power rack has a width defined from said first side to said second side;
      a back member extending between said top, said base, said first side, and said second side;
      a front portion opposite said back member and extending vertically between said top, said base, said first side, and said second side, wherein said front portion is open to an environment surrounding said integrated power rack, wherein said integrated power rack has a length defined from said front portion to said back member and the height is greater than the width and the length;
      a non-conductive divider extending from said top to said base and from said front portion to said back member, said non-conductive divider positioned between said first side and said second side;
      a revenue sub-compartment defined between said first side and said non-conductive divider from said front portion to said back member, said revenue sub-compartment sized to house said plurality of revenue producing devices, wherein said revenue sub-compartment has a width that is substantially the same as a width of each of said plurality of revenue producing devices; and
      a power sub-compartment defined between said second side and said non-conductive divider from said front portion to said back member such that said power sub-compartment is spaced from said revenue sub-compartment in a horizontal direction along said front portion, wherein said power sub-compartment houses power equipment for providing DC power to said revenue sub-compartment.

10. The data center according to claim 9, wherein said power equipment comprises a plurality of AC/DC converters spaced from said top to said base.

11. The data center according to claim 10, further comprising a DC rail electrically coupling one of said plurality of AC/DC converters to one of said plurality of revenue producing devices.

12. The data center according to claim 10, further comprising a plurality of DC rails electrically coupling one of said plurality of AC/DC converters to at least two of said plurality of revenue producing devices.

13. The data center according to claim 10, wherein said power equipment further comprises at least one energy storage device.

14. The data center according to claim 10, further comprising a plurality of DC rails electrically coupling one of said plurality of AC/DC converters to at least a portion of said plurality of revenue producing devices having a shortest distance from said one of said plurality of AC/DC converters.

15. The data center according to claim 9, wherein said revenue sub-compartment is sized to receive said plurality of revenue producing devices such that said plurality of revenue producing devices are vertically spaced from said base to said top.

16. A method of assembling an integrated power rack, said method comprising:
   providing a compartment including a top and a base spaced vertically apart from the top, wherein the integrated power rack has a height defined from the top to the base;
   positioning a first side between the base and the top;
   positioning a second side between the base and the top, wherein the integrated power rack has a width defined from the first side to the second side;
   positioning a back member between the top, the base, the first side, and the second side;
   positioning a front portion opposite from the back member, the front portion extending vertically between the top, the base, the first side, and the second side, wherein the front portion is open to an environment surrounding the integrated power rack, wherein the integrated power rack has a length defined from the front portion to the back member and the height is greater than the width and the length;
   positioning a non-conductive divider to extend from the top to the base and from the front portion to the back member, and between the first side and the second side;
   defining a revenue sub-compartment between the first side and the non-conductive divider from the front portion to the back member, the revenue sub-compartment sized to receive a plurality of revenue producing devices, wherein the revenue sub-compartment has a width that is substantially the same as a width of each of the plurality of revenue producing devices; and
   defining a power sub-compartment between the second side and the non-conductive divider from the front portion to the back member such that the power sub-compartment is spaced from the revenue sub-compartment in a horizontal direction along the front portion, wherein the power sub-compartment houses power equipment for providing DC power to the revenue sub-compartment.

17. The method of claim 16, further comprising spacing a plurality of AC/DC converters in the power sub-compartment from the top to the base.

18. The method of claim 17, further comprising electrically coupling a DC rail between one of the plurality of AC/DC converters and one of the plurality of revenue producing devices.

19. The method of claim 17, further comprising electrically coupling one of the plurality of AC/DC converters to at least two of the plurality of revenue producing devices.

20. The method of claim 17, further comprising positioning at least one energy storage device in the power sub-compartment.

\* \* \* \* \*